(12) United States Patent
Alexander et al.

(10) Patent No.: US 8,661,284 B2
(45) Date of Patent: Feb. 25, 2014

(54) METHOD AND SYSTEM TO IMPROVE THE OPERATIONS OF A REGISTERED MEMORY MODULE

(71) Applicants: James W. Alexander, Hillsboro, OR (US); Kuljit S. Bains, Olympia, WA (US); Howard S. David, Portland, OR (US)

(72) Inventors: James W. Alexander, Hillsboro, OR (US); Kuljit S. Bains, Olympia, WA (US); Howard S. David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/741,532

(22) Filed: Jan. 15, 2013

(65) Prior Publication Data
US 2013/0145197 A1    Jun. 6, 2013

Related U.S. Application Data

(62) Division of application No. 12/417,534, filed on Apr. 2, 2009, now Pat. No. 8,375,241.

(51) Int. Cl.
| | | |
|---|---|---|
| G06F 1/00 | (2006.01) | |
| G06F 1/26 | (2006.01) | |
| G06F 1/12 | (2006.01) | |
| G06F 1/04 | (2006.01) | |
| G11C 5/14 | (2006.01) | |
| G11C 8/00 | (2006.01) | |
| G06F 12/00 | (2006.01) | |

(52) U.S. Cl.
USPC ........... 713/500; 713/320; 713/400; 713/601; 365/227; 365/233.1; 711/105

(58) Field of Classification Search
USPC ................... 713/320, 400, 500, 601; 365/227, 365/233.1; 711/105
See application file for complete search history.

(56) References Cited

U.S. PATENT DOCUMENTS

| 7,036,032 B2* | 4/2006 | Mizuyabu et al. | 713/323 |
|---|---|---|---|
| 7,656,237 B2* | 2/2010 | Riley et al. | 331/25 |
| 7,800,422 B2* | 9/2010 | Lee et al. | 327/158 |
| 7,849,339 B2* | 12/2010 | Lee | 713/322 |
| 2004/0057330 A1* | 3/2004 | Wu | 365/233 |
| 2007/0201282 A1* | 8/2007 | Nakano | 365/189.09 |

* cited by examiner

*Primary Examiner* — Stefan Stoynov
(74) *Attorney, Agent, or Firm* — Blakely, Sokoloff, Taylor & Zafman LLP

(57) ABSTRACT

A method and system to improve the operations of a registered memory module. In one embodiment of the invention, the registered memory module allows asynchronous read and write operations when a clock circuit in the registered memory module is being activated. In another embodiment of the invention, the registered memory module allows enabling or disabling of its clock circuit without any interruption of its operation. When the clock circuit in the registered memory module is disabled, the power consumption of the registered memory module can be reduced. In yet another embodiment of the invention, the registered memory module is allowed to enter or exit an asynchronous operation mode without entering or exiting a self-refresh or pre-charge power down operation mode of the registered memory module.

6 Claims, 6 Drawing Sheets

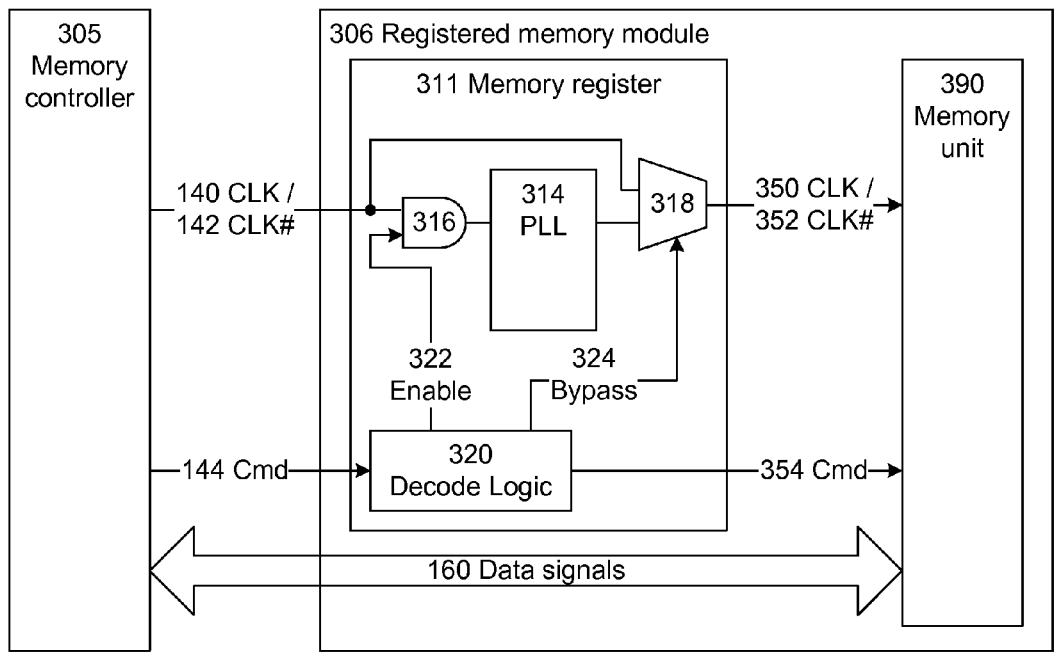
300                    FIG. 3A
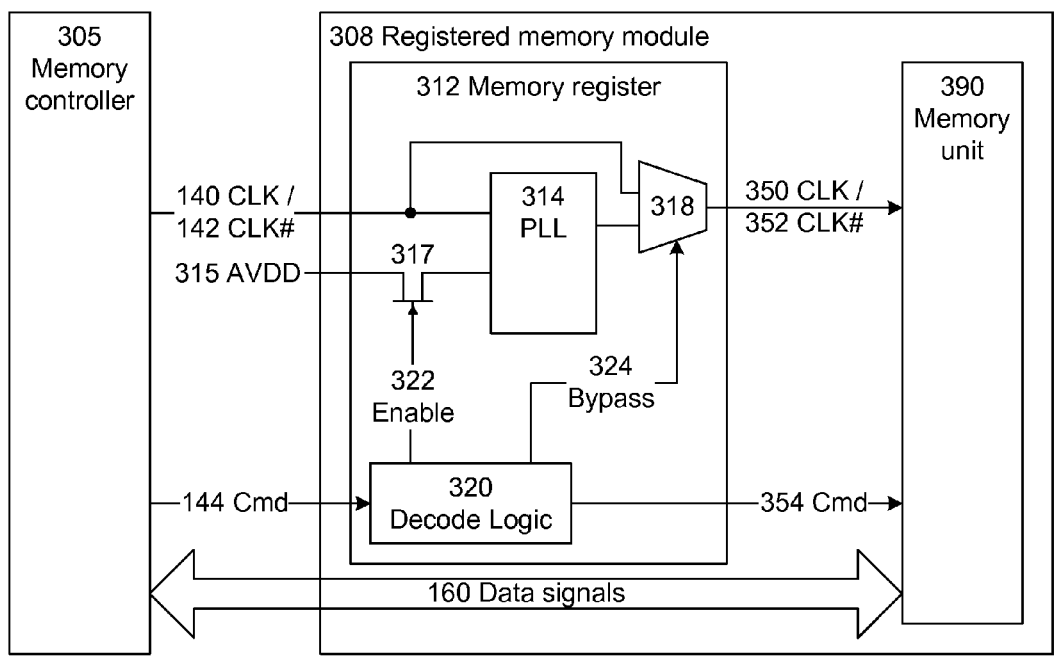
340                    FIG. 3B

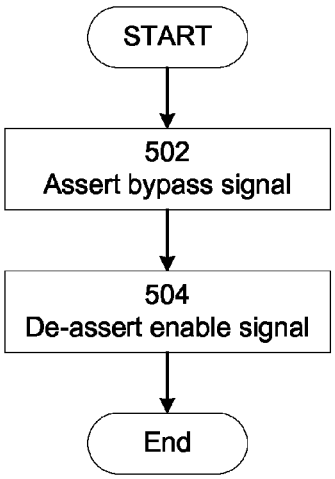
500  FIG. 5A
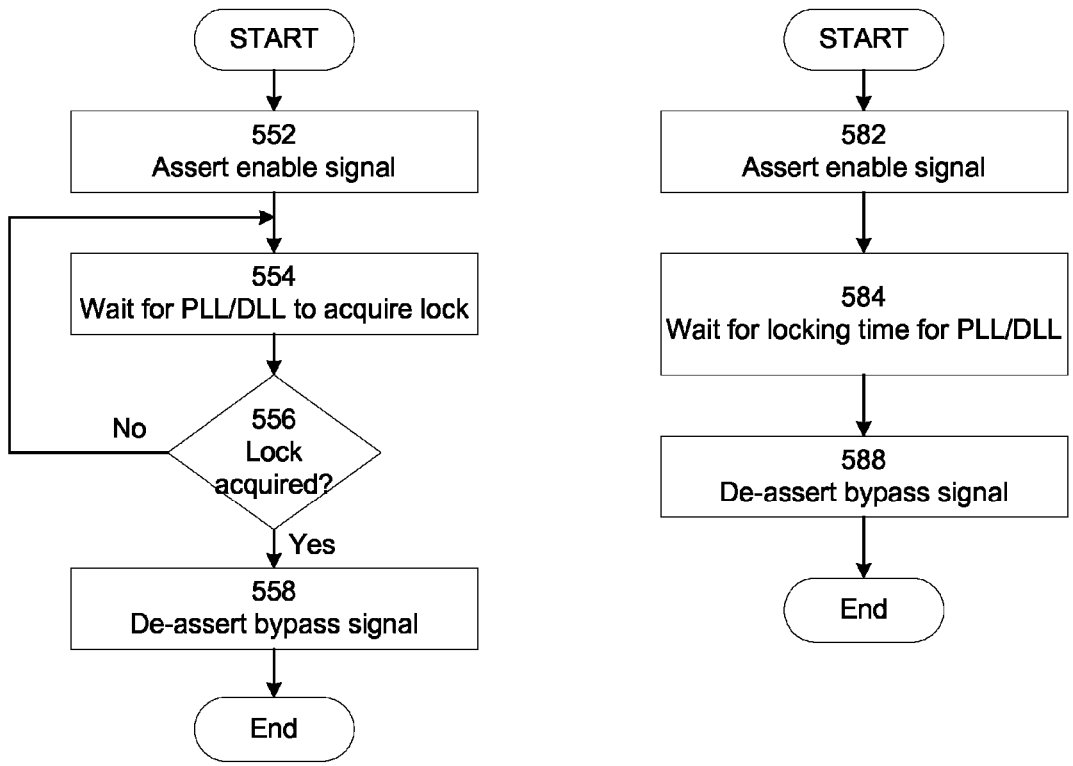
550  FIG. 5B
580  FIG. 5C

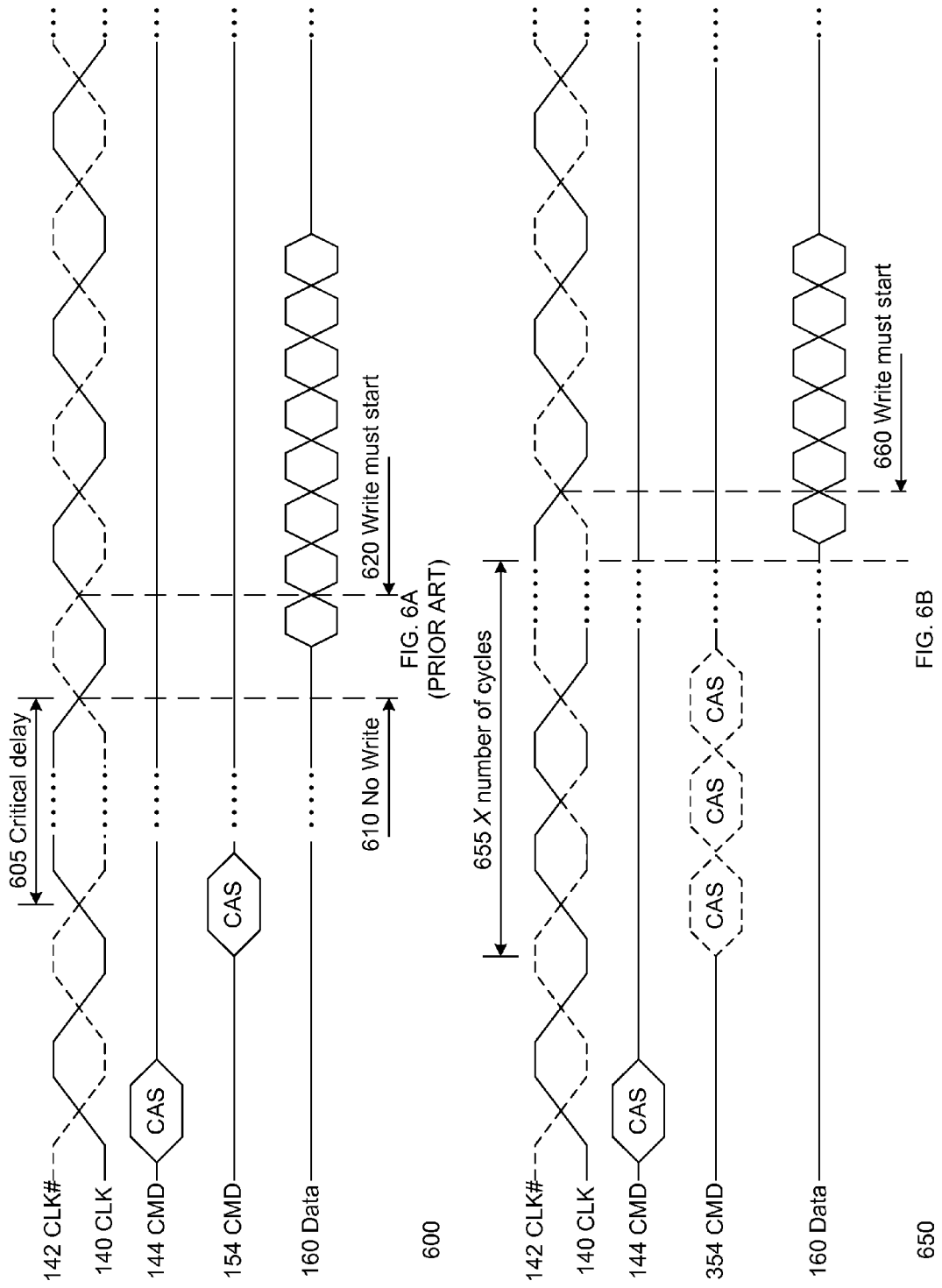

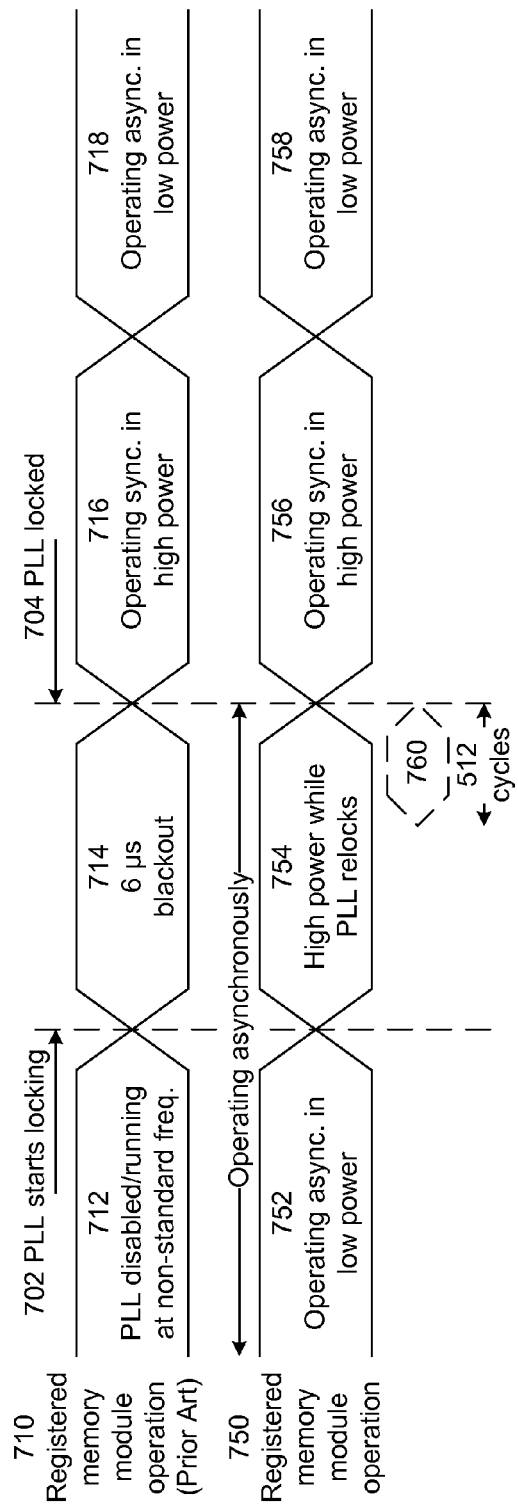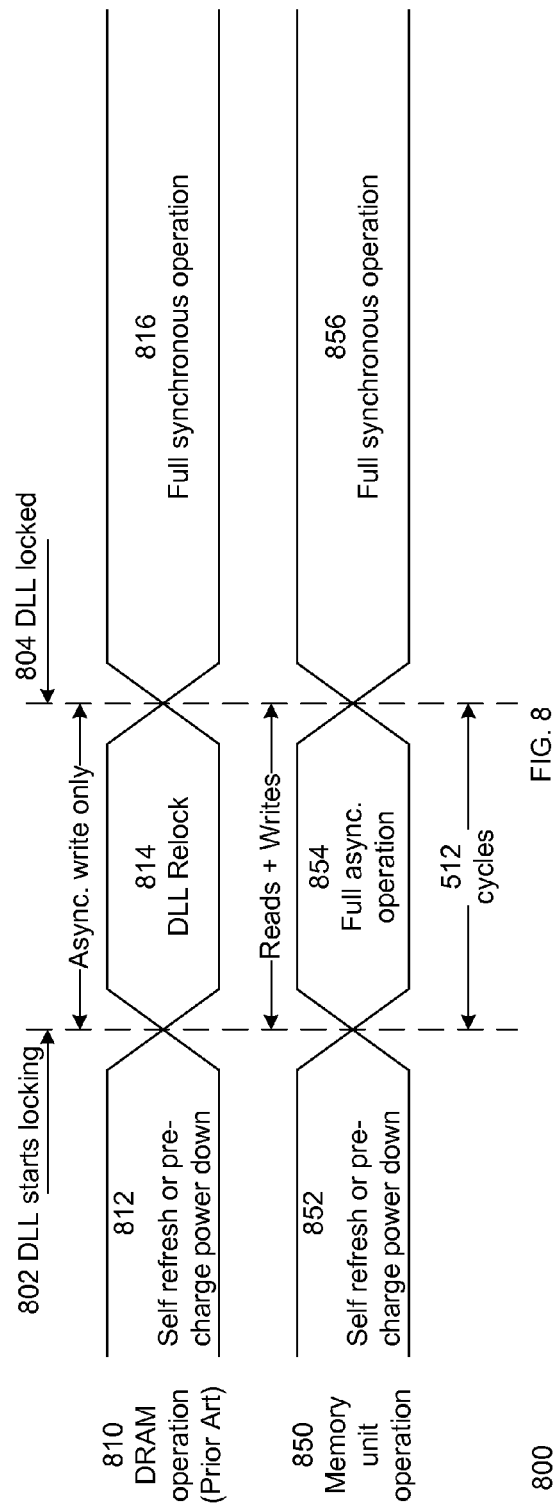

METHOD AND SYSTEM TO IMPROVE THE OPERATIONS OF A REGISTERED MEMORY MODULE

RELATED APPLICATIONS

This application is a divisional of U.S. Pat. No. 8,375,241, the contents of which are incorporated by reference herein.

FIELD OF THE INVENTION

This invention relates to a registered memory module, and more specifically but not exclusively, to improve the operations of the registered memory module.

BACKGROUND DESCRIPTION

In the block diagram 100 of a prior art registered memory module 120 as shown in FIG. 1, the memory register 122 buffers signals from the memory controller 110 to the dynamic random access memory (DRAM) 126. By buffering the signals from the memory controller 110, the electrical loading on the memory controller 110 is reduced and it increases the reliability of high-speed data access to the DRAM 126.

The memory register 122 has a phase-locked loop (PLL) 124 that is driven by a pair of input differential clocks CLK 140 and CLK# 142 from the memory controller 110. The dynamic power consumption of the PLL 124 is relatively higher than the power consumption of the other components present in the registered memory module 120. In addition, when the PLL 124 is locking to the input differential clocks CLK 140 and CLK# 142 to generate the output differential clocks CLK 150 and CLK# 152, no write or read operation to the DRAM 126 can be performed until the PLL 124 is locked.

BRIEF DESCRIPTION OF THE DRAWINGS

The features and advantages of embodiments of the invention will become apparent from the following detailed description of the subject matter in which:

FIG. 3A illustrates a block diagram of a registered memory module in accordance with one embodiment of the invention;

FIG. 3B illustrates a block diagram of a registered memory module in accordance with one embodiment of the invention;

FIG. 5A illustrates a flowchart of switching the operation mode of a clock circuit from normal to bypass mode in accordance with one embodiment of the invention;

FIG. 5B illustrates a flowchart of switching the operation mode of a clock circuit from bypass to normal mode in accordance with one embodiment of the invention;

FIG. 5C illustrates a flowchart of switching the operation mode of a clock circuit from bypass to normal mode in accordance with one embodiment of the invention;

FIG. 6A illustrates a prior art timing diagram of a write operation to a prior art registered memory module;

FIG. 6B illustrates a timing diagram of a write operation to a registered memory module in bypass mode in accordance with one embodiment of the invention;

FIG. 7 illustrates a comparison between a switching sequence of a prior registered memory module and a switching sequence of a registered memory module in accordance with one embodiment of the invention;

FIG. 8 illustrates a comparison between a switching sequence of a prior art DRAM and a switching sequence of a memory unit in accordance with one embodiment of the invention.

DETAILED DESCRIPTION

Figure 1:
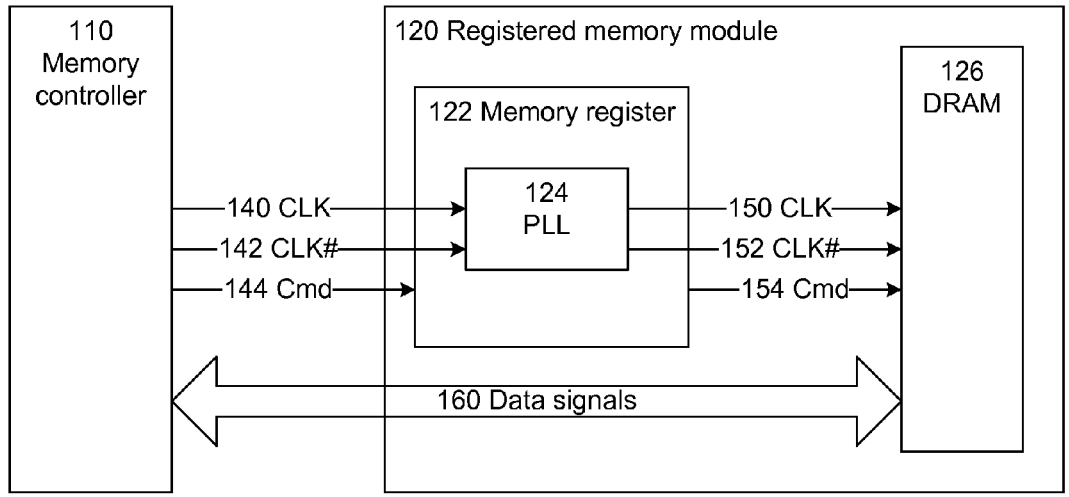
FIG. 1 illustrates a block diagram of a prior art registered memory module.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system to improve the operations of a registered memory module. In one embodiment of the invention, the registered memory module allows asynchronous read and write operations when a clock circuit in the registered memory module is being activated. The clock circuit includes, but is not limited to, a PLL, a delay-locked loop (DLL) and the like. For example, in one embodiment of the invention, when the PLL in a registered memory module is activating, i.e., the PLL is locking to an input clock signal, the registered memory module does not need to wait for the PLL to be locked before any asynchronous read or write operations to the registered memory module is performed.

In another embodiment of the invention, the registered memory module allows enabling or disabling of its clock circuit without any interruption of its operation. When the clock circuit in the registered memory module is disabled, the power consumption of the registered memory module can be reduced. In yet another embodiment of the invention, the registered memory module is allowed to enter or exit an asynchronous operation mode without entering or exiting a self-refresh or pre-charge power down operation mode of the registered memory module.

Figure 2:
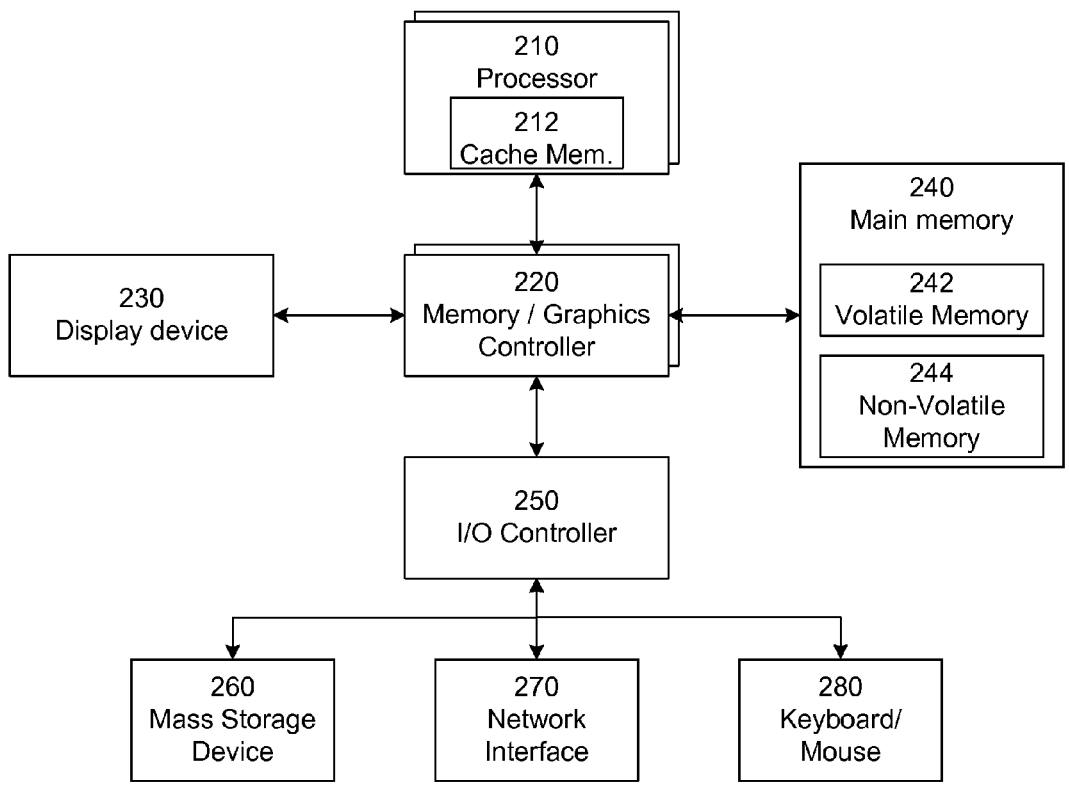
FIG. 2 illustrates a system to implement the methods disclosed herein in accordance with one embodiment of the invention.

FIG. 2 illustrates a system 200 to implement the methods disclosed herein in accordance with one embodiment of the invention. The system 200 includes but is not limited to, a desktop computer, a laptop computer, a notebook computer, a netbook computer, a personal digital assistant (PDA), a server, a workstation, a cellular telephone, a mobile computing device, an Internet appliance or any other type of computing device. In another embodiment, the system 200 used to implement the methods disclosed herein may be a system on a chip (SOC) system.

The system 200 includes a memory/graphics controller 220 and an I/O controller 250. The memory/graphics controller 220 typically provides memory and I/O management functions, as well as a plurality of general purpose and/or special purpose registers, timers, etc. that are accessible or used by the processor 210. The processor 210 may be implemented using one or more processors or implemented using multi-core processors. The memory/graphics controller 220 performs functions that enable the processor 210 to access and communicate with a main memory 240 that includes a volatile memory 242 and/or a non-volatile memory 244. In one embodiment of the invention, the main memory 240 is a registered memory module that allows asynchronous read and write operations when a clock circuit in the registered memory module is being activated.

The volatile memory 242 includes, but is not limited to, Synchronous Dynamic Random Access Memory (SDRAM), Dynamic Random Access Memory (DRAM), RAMBUS DRAM (RDRAM), Double Data Rate three SDRAM (DDR3 SDRAM), and/or any other type of random access memory device. The non-volatile memory 244 includes, but is not limited by, NAND flash memory, Read Only Memory (ROM), Electrically Erasable Programmable ROM (EEPROM), and/or any other desired type of memory device. The main memory 240 stores information and instructions to be executed by the processor 210. The main memory 240 may also store temporary variables or other intermediate information while the processor 210 is executing instructions. In another embodiment of the invention, the memory/graphics controller 220 is part of the processor 210.

The memory/graphics controller 220 is connected to a display device 230 that includes, but not limited to, liquid crystal displays (LCDs), cathode ray tube (CRT) displays, or any other form of visual display device. The I/O controller 250 is coupled with, but is not limited to, a storage device(s) 260, a network interface 270, and a keyboard/mouse 280. In particular, the I/O controller 250 performs functions that enable the processor 210 to communicate with the storage device 260, the network interface 270, and the keyboard/mouse 280.

The network interface 270 is implemented using any type of well-known network interface standard including, but not limited to, an Ethernet interface, an USB interface, a Peripheral Component Interconnect (PCI) Express interface, a wireless interface and/or any other suitable type of interface. The wireless interface operates in accordance with, but is not limited to, the Institute of Electrical and Electronics Engineers (IEEE) wireless standard family 802.11, Home Plug AV (HPAV), Ultra Wide Band (UWB), Bluetooth, WiMax, or any other form of wireless communication protocol.

In one embodiment of the invention, the bus(es) shown in FIG. 2 is a communication link shared by all components connected to it. In another embodiment of the invention, the bus(es) shown in FIG. 2 is a point-to-point communication link between pairs of components connected each other. While the components shown in FIG. 2 are depicted as separate blocks within the system 200, the functions performed by some of these blocks may be integrated within a single semiconductor circuit or may be implemented using two or more separate integrated circuits. For example, although the memory/graphics controller 220 and the I/O controller 250 are depicted as separate blocks, one of ordinary skill in the relevant art will readily appreciate that the memory/graphics controller 220 and the I/O controller 250 may be integrated within a single semiconductor circuit.

FIG. 3A illustrates a block diagram 300 of a registered memory module 306 in accordance with one embodiment of the invention. For simplicity and clarity of illustration, FIG. 3A illustrates the logic for only one of the pair of input differential clocks CLK 140 and CLK# 142. One of ordinary skill in the relevant art will readily appreciate how to apply embodiments of the invention disclosed herein to both CLK 140 and CLK# 142 and it shall not be discussed herein.

The registered memory module 306 has a memory register 311 and a memory unit 390. The memory unit 390 may be a volatile or non-volatile memory and may include a plurality of memory banks in one embodiment of the invention. The memory controller 305 provides a pair of input differential clocks CLK 140 and CLK# 142 to the registered memory module 306. In one embodiment of the invention, the memory controller 305 and the registered memory module 306 are at least partly compliant with one or more of the specifications defining the Joint Electron Device Engineering Council (JEDEC) DDR3 SDRAM standard (JEDEC DDR3 SDRAM standard, "JEDEC Standard DDR3 SDRAM", Revision JESD79-3C dated November 2008) including, for example, all control, command, and address signals from the memory controller 305 are sampled by the registered memory module 306 on the crossing of the positive edge of CLK 140 and the negative edge of CLK# 142.

In one embodiment of the invention, the memory register 311 has logic to facilitate enabling or disabling the PLL 314 without any interruption to the operation of the memory unit 390. For example, in one embodiment of the invention, the memory register 311 has a AND gate 316 to enable or disable the connection between the input differential clocks CLK 140/CLK# 142 and the PLL 314. In other embodiments of the invention, other types of logic such as a Not AND (NAND) gate can be used. One of ordinary skill in the relevant art will readily appreciate how to use alternative logic to enable or disable the connection between the input differential clocks CLK 140/CLK# 142 and the PLL 314 without affecting the workings of the invention.

The AND gate 316 has an input signal that is connected to the enable signal 322 from a decode logic 320. In one embodiment of the invention, the memory controller 305 can send a command signal via the command line 144 to the registered memory module 306 to enable or disable the PLL 314. The decode logic 320 in the memory register 311 receives the command signal and generates an appropriate enable signal 322 to enable or disable the AND gate 316 after the received command signal is decoded. For example, when the decode logic 320 decodes that the received command signal is to enable or activate the PLL 314, the decode logic 320 asserts the enable signal 322 to allow the input differential clocks CLK 140/CLK# 142 to pass through the AND gate 316 to reach the PLL 314.

Similarly, when the decode logic 320 decodes that the received command signal is to disable or deactivate the PLL 314, the decode logic 320 de-asserts the enable signal 322 to prevent or stop the input differential clocks CLK 140/CLK# 142 from passing through the AND gate 316 to reach the PLL 314. When there is no input clock provided to the PLL 314, the PLL 314 is disabled or deactivated. By disabling the PLL 314, the power consumption of the PLL 314 is reduced to static power consumption.

In one embodiment of the invention, the memory register 311 has logic to bypass the output clock(s) of the PLL 314 as the input clock to the memory unit 390. For example, in one embodiment of the invention, the memory register 311 has a multiplexer 318 to select between the input differential clocks CLK 140/CLK# 142 and the output differential clocks of the PLL 314 as the input differential clocks CLK 350/CLK# 352 to the memory unit 390. The decode logic 320 generates a bypass signal 324 to the multiplexer 318 to select between the input differential clocks CLK 140/CLK# 142 and the output differential clocks of the PLL 314 as the input differential clocks to the DRAM 390.

In one embodiment of the invention, the memory controller 305 can send a command signal via the command line 144 to the registered memory module 306 to set the PLL 314 in bypass or normal mode. The decode logic 320 in the memory register 311 receives the command signal and generates appropriate enable signal 322 and/or bypass signal 324 to set the PLL 314 in bypass or normal mode after the received command signal is decoded. For example, when the decode logic 320 decodes that the received command signal is to set the PLL 314 in bypass mode, the decode logic 320 asserts the bypass signal 324 to the multiplexer 318 to select the input differential clocks CLK 140/CLK# 142 as the input differential clocks to the DRAM 390. The decode logic 320 may optionally de-assert the enable signal 322 to deactivate the PLL 314.

Similarly, when the decode logic 320 decodes that the received command signal is to set the PLL 314 in normal mode, the decode logic 320 asserts the enable signal 322 to the AND gate 316. After the PLL 314 is locked, the decode logic 320 de-asserts the bypass signal 324 to the multiplexer 318 to select the output differential clocks of the PLL 314 as the input differential clocks to the memory unit 390. In one embodiment of the invention, the multiplexer 318 is a glitch free multiplexer, i.e., when the multiplexer 318 is switching between its input signals, it does not introduce glitches into its output signal that can be detected by the memory unit 390.

By setting the PLL 314 in bypass mode, the memory controller 305 can communicate or operate the registered memory module 306 asynchronously. When the PLL 314 is disabled and set in bypass mode, it allows the system 200 to maintain asynchronous operation of the registered memory module 306 and to reduce the power consumption of the memory register 311. In addition, in one embodiment of the invention, the register memory module 311 can facilitate enabling or disabling the PLL 314 without any interruption to the operation of the memory unit 390.

For example, in one embodiment of the invention, when the memory controller 305 wants to change the operation of the register memory module 306 from an asynchronous to a synchronous mode, the memory controller 305 activates the PLL 314 and can continue to communicate asynchronously with the register memory module 306 without waiting for the PLL 314 to be locked. In one embodiment of the invention, when the PLL 314 is locked, the memory controller 305 sends a command signal via the command line 144 to the register memory module 311 to set the PLL 314 in normal mode, i.e., activating the PLL 314, disabling the bypass of the output clock of the PLL 314 as the input clock to the DRAM 390 and sets the output clock of the PLL 314 as the input clock to the memory unit 390. In another embodiment of the invention, when the PLL 314 is locked, the decode logic 320 sets the PLL 314 in normal mode without receiving any command from the memory controller 305, i.e., asserting the enable signal 322 and after the PLL 314 is locked, de-asserting the bypass signal 324.

FIG. 3B illustrates a block diagram 340 of a registered memory module 308 in accordance with one embodiment of the invention. For simplicity and clarity of illustration, FIG. 3B illustrates the logic for only one of the pair of differential clocks CLK 140 and CLK# 142. One of ordinary skill in the relevant art will readily appreciate how to apply embodiments of the invention disclosed herein to both CLK 140 and CLK# 142 and it shall not be discussed herein.

The registered memory module 308 has a memory register 312 and a memory unit 390. The memory register 312 has the same PLL 314, multiplexer 318, and decode logic 320 as in memory register 311 and their operations and functions shall not be repeated herein. In one embodiment of the invention, the memory register 312 has logic to facilitate enabling or disabling the PLL 314 by controlling the power to the PLL 314. For example, in one embodiment of the invention, the memory register 312 has a power gate 317 that controls the core power supply (Analog Voltage Drain Drain, AVDD 315) to the PLL 314. In one embodiment of the invention, the power gate 317 is a Field Effect Transistor (FET).

In one embodiment of the invention, the memory controller 305 can send a command signal via command line 144 to the registered memory module 308 to enable or disable the PLL 314. The decode logic 320 in the memory register 312 receives the command signal and generates an appropriate enable signal 322 to enable or disable the power gate 317 after the received command signal is decoded. For example, when the decode logic 320 decodes that the received command signal is to enable or activate the PLL 314, the decode logic 320 asserts the enable signal 322 to turn on the power gate 317 to allow the AVDD 315 to power up the PLL 314.

Similarly, when the decode logic 320 decodes that the received command signal is to disable or deactivate the PLL 314, the decode logic 320 de-asserts the enable signal 322 to switch off the power gate 317 to prevent or stop the AVDD 315 from powering up the PLL 314. By disabling the PLL 314 by turning off its power, the power consumption of the PLL 314 is reduced to zero.

In one embodiment of the invention, when the PLL 314 is disabled, the frequency of the input differential clocks CLK 140/CLK# 142 can be changed in a single machine cycle without waiting for the re-acquisition of the PLL 314 at the new frequency, i.e., there is no need to wait for the PLL 314 to be locked. The registered memory module 308 is able to track instantaneous changes in the input clock frequency when operating in asynchronous mode, including the clocks being stopped for some periods of time.

Figure 3C:
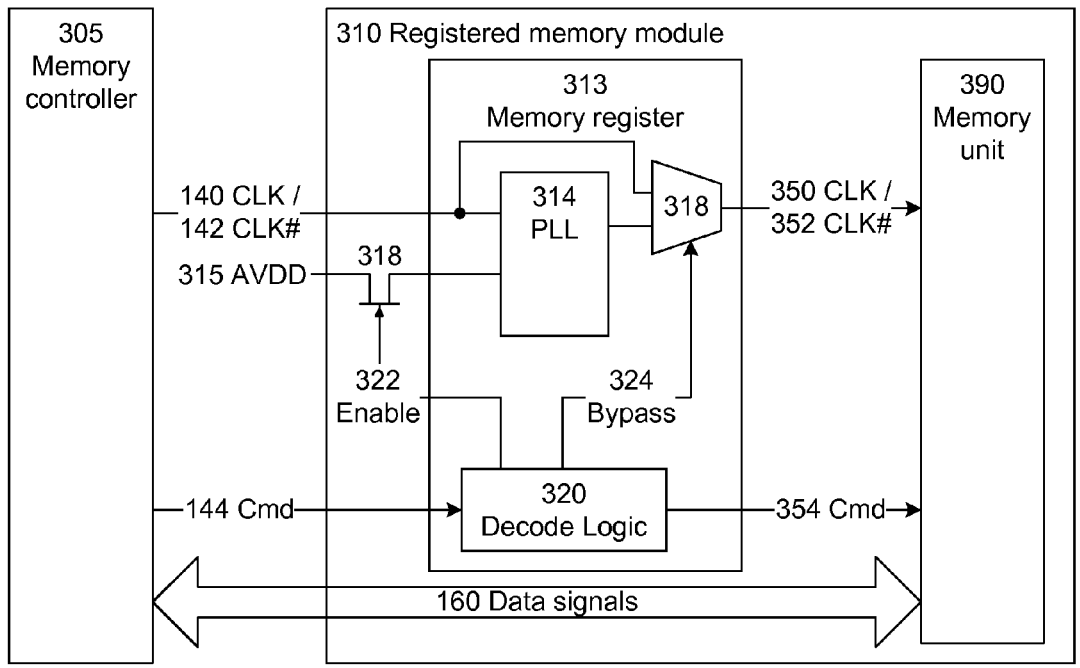
FIG. 3C illustrates a block diagram of a registered memory module in accordance with one embodiment of the invention.

FIG. 3C illustrates a block diagram 360 of a registered memory module 310 in accordance with one embodiment of the invention. For simplicity and clarity of illustration, FIG. 3C illustrates the logic for only one of the pair of differential clocks CLK 140 and CLK# 142. One of ordinary skill in the relevant art will readily appreciate how to apply embodiments of the invention disclosed herein to both CLK 140 and CLK# 142 and it shall not be discussed herein.

In one embodiment of the invention, the registered memory module 310 has a power gate 318 that is external to the memory register 313. The memory register 313 has the same PLL 314, multiplexer 318, and decode logic 320 as in memory register 311 and their operations and functions shall not be repeated herein. The enable signal 322 of the decode logic 320 is connected with the gate terminal of the external power gate 318. The power gates 317 and 318 shown in FIG. 3B and FIG. 3C are not meant to be limiting. One of ordinary skill in the relevant art will readily appreciate that other alternative logic or circuit can be implemented to control the AVDD 315 to the PLL 314 without affecting the workings of the invention.

Figure 4:
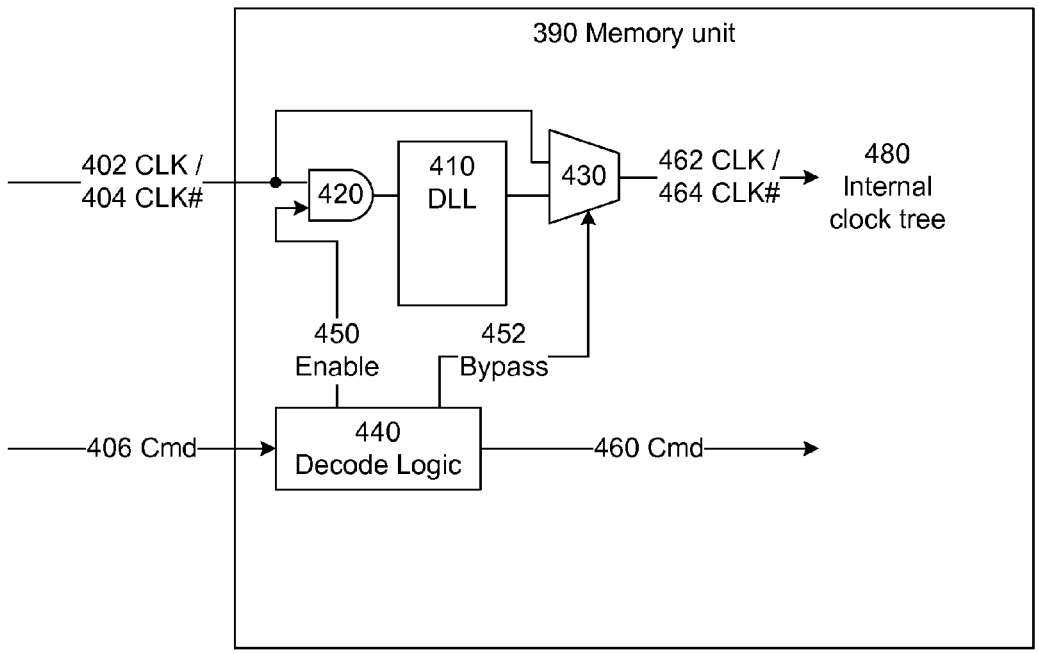
FIG. 4 illustrates a block diagram of a memory unit in accordance with one embodiment of the invention.

FIG. 4 illustrates a block diagram 400 of a memory unit 390 in accordance with one embodiment of the invention. For simplicity and clarity of illustration, FIG. 4 illustrates the logic for only one of the pair of differential clocks CLK 402 and CLK# 404. One of ordinary skill in the relevant art will readily appreciate how to apply embodiments of the invention disclosed herein to both CLK 402 and CLK# 404 and it shall not be discussed herein. The block diagram 400 shows a DLL 410 in the memory unit 390. For simplicity and clarity of illustration, the other modules or elements such as the memory banks of the memory unit 390 are not shown in FIG. 4.

In one embodiment of the invention, the memory unit 390 has logic to facilitate entering or exiting an asynchronous operation mode without entering or exiting a self-refresh or pre-charge power down operation mode. For example, in one embodiment of the invention, the memory unit 390 has a AND gate 420 to enable or disable the connection between the input differential clocks CLK 402/CLK# 404 and the DLL 410. In other embodiments of the invention, other types of logic such as a Not AND (NAND) gate can be used. One of ordinary skill in the relevant art will appreciate how to use alternative logic to enable or disable the connection between the input differential clocks CLK 402/CLK# 404 and the DLL 410 without affecting the workings of the invention.

The AND gate 420 has an input signal connected to the enable signal 450 from a decode logic 440. In one embodiment of the invention, the memory unit 390 receives a command signal via command line 406 to enable or disable the DLL 410. The decode logic 440 in the memory unit 390 receives the command signal and generates an appropriate enable signal 450 to enable or disable the AND gate 420 after the received command signal is decoded. For example, when the decode logic 440 decodes that the received command signal is to enable or activate the DLL 410, the decode logic 440 asserts the enable signal 450 to allow the input differential clocks CLK 402/CLK# 404 to pass through the AND gate 420 to reach the DLL 410.

Similarly, when the decode logic 440 decodes that the received command signal is to disable or deactivate the DLL 410, the decode logic 440 de-asserts the enable signal 450 to prevent or stop the input differential clocks CLK 402/CLK# 404 from passing through the AND gate 420 to reach the DLL 410. When there is no input clock provided to the DLL 410, the DLL 410 is disabled or deactivated. By disabling the DLL 410, the power consumption of the DLL 410 is reduced to static power consumption.

In one embodiment of the invention, the memory unit 390 has logic to bypass the output clock(s) of the DLL 410 as the input clock to the internal clock tree of the memory unit 390. For example, in one embodiment of the invention, the memory unit 390 has a multiplexer 430 to select between the input differential clocks CLK 402/CLK# 404 and the output differential clocks of the DLL 410 as the input differential clocks CLK 462/CLK# 464 to the internal clock tree 480 of the memory unit 390. The decode logic 440 generates a bypass signal 452 to the multiplexer 430 to select between the input differential clocks CLK 402/CLK# 404 and the output differential clocks of the DLL 410 as the input differential clocks CLK 462/CLK# 464 to the internal clock tree 480 of the memory unit 390.

In one embodiment of the invention, the memory unit 390 receives a command signal via the command line 406 to set the DLL 410 in bypass or normal mode. The decode logic 440 in the memory unit 390 receives the command signal and generates appropriate enable signal 450 and/or bypass signal 452 to set the DLL 410 in bypass or normal mode after the received command signal is decoded. For example, when the decode logic 440 decodes that the received command signal is to set the DLL 410 in bypass mode, the decode logic 440 asserts the bypass signal 452 to the multiplexer 430 to select the input differential clocks CLK 402/CLK# 404 as the input differential clocks CLK 462/CLK# 464 to the internal clock tree 480 of the memory unit 390. The decode logic 440 may optionally de-assert the enable signal 450 to deactivate the DLL 410.

Similarly, when the decode logic 440 decodes that the received command signal is to set the DLL 410 in normal mode, the decode logic 440 asserts the enable signal 450 to activate the DLL 410. After the DLL is locked, the decode logic 440 de-asserts the bypass signal 452 to the multiplexer 430 to select the output differential clocks of the DLL 410 as the input differential clocks CLK 462/CLK# 464 to the internal clock tree 480 of the memory unit 390. The JEDEC DDR3 SDRAM standard specifies that a DDR3 SDRAM has to enter a self-refresh or pre-charge power down mode before entering an asynchronous mode and vice versa. The memory unit 390 can enter or exit an asynchronous operation mode without entering or exiting a self-refresh or pre-charge power down operation mode in one embodiment of the invention. This is because the logic in the memory unit 390 allows the DLL 410 to be bypassed and the memory unit 390 operates in an asynchronous mode when the DLL 410 is bypassed.

FIG. 5A illustrates a flowchart 500 of switching the operation mode of a clock circuit from normal to bypass mode in accordance with one embodiment of the invention. For clarity of illustration, FIG. 5A is discussed with reference to FIG. 3A. One of ordinary skill in the relevant will readily appreciate that the sequence to transition the operation mode of the clock circuit from normal to bypass mode applies to other embodiments of the invention disclosed herein.

In a normal operating mode of the PLL 314, the bypass signal 324 is de-asserted, i.e., the multiplexer 318 selects the output differential clocks of the PLL 314 as the input differential clocks CLK 350/CLK# 352 to the memory unit 390. In addition, the enable signal 322 is asserted and the PLL 314 is activated or enabled.

In step 502, the decode logic 320 asserts the bypass signal 324. For example, in one embodiment of the invention, the memory controller 305 sends a command signal via the command line 144 to the registered memory module 306 to bypass the output clock(s) of the PLL 314 to the memory unit 390. The decode logic 320 decodes the received command signal and asserts the bypass signal 324 to the multiplexer 318 to select the input differential clocks CLK 140/CLK# 142 as the input clock to the memory unit 390. When step 502 is completed, the memory controller 305 can operate the registered memory module 306 in an asynchronous mode.

In step 504, the decode logic de-asserts the enable signal 322. For example, in one embodiment of the invention, the memory controller 305 sends a command signal via the command line 144 to the registered memory module 306 to disable the PLL 314. The decode logic 320 decodes the command 144 and de-asserts the enable signal 322 to the AND gate 316 to prevent the input differential clocks CLK 140/CLK# 142 from reaching the PLL 314. When step 504 is completed, the PLL 314 is disabled or deactivated as there is no input clock(s) to the PLL 314.

In one embodiment of the invention, the memory controller 305 sends a single command signal to switch the registered memory module 306 from normal to bypass mode and disables the PLL 314, i.e., it is not required to send a command to bypass the output clocks of the PLL 314 as the input clocks to the memory unit 390 and send another command to disable the PLL 314. For example, in one embodiment of the invention, the memory controller 305 sends a command signal to the registered memory module 306 to switch the operation mode of the registered memory module 306 from normal to bypass mode. The decode logic 320 decodes the command signal and determines that there is an indication in the command signal to switch the registered memory module 306 from normal to bypass mode and to disable the PLL 314. The decode logic 320 performs the steps of 502 and 504 based on the indication. In one embodiment of the invention, the indication is a register bit in a command register that is read by the decode logic 320. One of ordinary skill in the relevant art will readily appreciate that other methods can be used by the memory controller 305 to inform the registered memory module 306 to switch its operation from normal to bypass mode and to disable the PLL 314 and these other methods can be used without affecting the workings of the invention.

FIG. 5B illustrates a flowchart 550 of switching the operation mode of a clock circuit from bypass to normal mode in accordance with one embodiment of the invention. For clarity of illustration, FIG. 5A is discussed with reference to FIG. 4. One of ordinary skill in the relevant will readily appreciate that the sequence to transition the operation mode of the clock circuit from bypass to normal mode applies to other embodiments of the invention disclosed herein.

In bypass operating mode of the DLL 410, the bypass signal 452 is asserted, i.e., the multiplexer 430 selects the input differential clocks CLK 402/CLK# 404 of the DLL 410 as the input differential clocks CLK 462/CLK# 464 to the internal clock tree 480 of the memory unit 390. The DLL 410 can be activated or deactivated in bypass operating mode.

In step 552, the decode logic 440 asserts the enable signal 450 if the enable signal 450 is not asserted. For example, in one embodiment of the invention, the decode logic 450 receives a command signal via the command line 406 to activate the DLL 410. The decode logic 440 decodes the received command signal and asserts the enable signal 450 to the AND gate 420 to allow the input differential clocks CLK 402/CLK# 404 to reach the DLL 410.

In step 554, the flow 550 waits for the DLL 410 to acquire a lock signal. In one embodiment of the invention, the lock signal is sent to the decode logic 440. In another embodiment of the invention, the lock signal is sent to a memory register or a memory controller coupled with the memory unit 390. In step 556, the flow 550 checks if the DLL 410 has acquired a lock signal, i.e., the DLL 410 is locked to the input differential clocks CLK 402/CLK# 404. If no, the flow 550 goes back to the step 554. If yes, the decode logic 440 de-asserts the bypass signal 452 and the flow ends. For example, in one embodiment of the invention, the decode logic 440 receives the lock signal and de-asserts the bypass signal 452 to multiplexer 430 to select the output differential clocks of the DLL 410 as the input differential clocks CLK 462/CLK# 464 to the internal clock tree 480 of the memory unit 390. In another embodiment of the invention, a memory controller receives the lock signal and sends a command signal via the command line 406 to the memory unit 390 to change the operation of the DLL 410 into normal mode. The decode logic receives the command signal and de-asserts the bypass signal 452 to the multiplexer 430.

FIG. 5C illustrates a flowchart 580 of switching the operation mode of a clock circuit from bypass to normal mode in accordance with one embodiment of the invention. For clarity of illustration, FIG. 5A is discussed with reference to FIG. 4. One of ordinary skill in the relevant art will readily appreciate that the sequence to transition the operation mode of the clock circuit from bypass to normal mode applies to other embodiments of the invention disclosed herein.

In bypass operating mode of the DLL 410, the bypass signal 452 is asserted, i.e., the multiplexer 430 selects the input differential clocks CLK 402/CLK# 404 of the DLL 410 as the input differential clocks CLK 462/CLK# 464 to the internal clock tree 480 of the memory unit 390. The DLL 410 can be activated or deactivated in bypass operating mode.

In step 582, the decode logic 440 asserts the enable signal 450 if the enable signal 450 is not asserted. For example, in one embodiment of the invention, the decode logic 450 receives a command signal via the command line 406 to activate the DLL 410. The decode logic 440 decodes the received command signal and asserts the enable signal 450 to the AND gate 420 to allow the input differential clocks CLK 402/CLK# 404 to reach the DLL 410.

In step 584, the flow 550 waits for a locking time for the PLL/DLL. For example, in one embodiment of the invention, the memory controller coupled with the DLL 410 waits for 512 cycles or counts down 512 cycles after the enable signal 450 is asserted. In another embodiment of the invention, the memory controller coupled with the PLL 410 counts down six microseconds after the enable signal 450 is asserted. The locking time for the PLL/DLL is set such that the PLL/DLL is given sufficient time to acquire a lock signal. For example, in one embodiment of the invention, the locking time for the PLL/DLL is set to the maximum time required, after considering factors such as operating temperature, process corners and the like, for a particular PLL/DLL to acquire a lock signal. One of ordinary skill in the relevant art will readily appreciate how to use other methods to set the locking time for the PLL/DLL without affecting the workings of the invention.

In step 588, the decode logic 440 de-asserts the bypass signal 452 and the flow ends. For example, in one embodiment of the invention, the decode logic 440 receives a command signal via the command line 406 to de-assert the bypass signal 452 to the multiplexer 430. When the bypass signal 452 is de-asserted, the output differential clocks of the DLL 410 is set as the input differential clocks CLK 462/CLK# 464 to the internal clock tree 480 of the memory unit 390.

FIG. 6A illustrates a prior art timing diagram 600 of a write operation to a prior art registered memory module 120. For clarity of illustration, FIG. 6A is discussed with reference to FIG. 1. The write operation illustrated in FIG. 6A is at least partly compliant with the JEDEC DDR3 SDRAM standard. The memory controller 110 sends differential clocks CLK 140 and CLK# 142 to the PLL 124. The memory register 122 samples or reads the command signal via the command line 144 from the memory controller 110 when the positive edge of CLK 140 crosses the negative edge of CLK# 142. The memory controller 110 sends a Column Access Strobe (CAS) signal via the command line 144 as shown in FIG. 6A when the positive edge of CLK 140 crosses the negative edge of CLK# 142.

The memory register 122 buffers the CAS signal received via the command line 144 for one clock cycle and sends out the buffered CAS signal via the command line 154 to the DRAM 126. The CAS signal sent to the DRAM 126 via the command line 154 is illustrated in FIG. 6A as being one clock cycle after the CAS signal sent by the memory controller 110 via the command line 144. The critical delay 605 starts from the time when the buffered CAS signal is sent via the command 154 to the DRAM 126 to the time 610. The critical delay 605 is enforced by the PLL 124 and is fixed. The memory controller 110 is not allowed to send any data on data line 160 during the critical delay 605. The data on the data line 160 are read or sampled on each crossing of CLK 140 and CLK# 142. The memory controller 110 has one clock cycle after the time 610 to send data on the data line 160 to the DRAM 126. The time 620 shows the latest time where the write operation is to commence.

FIG. 6B illustrates a timing diagram 650 of a write operation to a registered memory module 306 in bypass mode in one embodiment of the invention. For clarity of illustration, FIG. 6B is discussed with reference to FIG. 3A. The timing diagram of FIG. 6B also applies to other embodiments of the invention disclosed herein. The registered memory module 306 is set in bypass mode, i.e., the differential clocks CLK 140 and CLK# 142 are set as the input differential clocks CLK 350 and CLK# 352 to the DRAM 390. When the PLL 314 is bypassed, the critical delay 605 expected by the memory unit 390 is no longer fixed at a constant delay. The CAS signal received by the memory unit 390 via the command line 354 can have a variable delay (illustrated by multiple CAS signals shown in dashed lines) after the CAS signal is sent by the memory controller 305 via the command line 144.

If the memory unit 390 follows the same timing requirement of 600, it may not see the data in the correct sequence. As such, to overcome this problem, in one embodiment of the invention, the write operation of the registered memory module 306 and the memory controller 305 allows a variable number of clock cycles to elapse before data is sent to the memory unit 390 during a write operation to the memory unit 390. This allows the memory unit 390 to be more tolerant of the arrival of the data on the data line 160.

FIG. 7 illustrates a comparison between a switching sequence 710 of a prior art registered memory module 120 and a switching sequence 750 of a registered memory module 306 in accordance with one embodiment of the invention. For clarity of illustration, switching sequence 710 is discussed with reference to FIG. 1 and switching sequence 750 is discussed with reference to FIG. 3A. One of ordinary skill in the relevant will readily appreciate that the switching sequence 750 applies to other embodiments of the invention disclosed herein.

Referring to FIGS. 1 and 7, in switching sequence 710, the PLL 124 of the prior art registered memory module 120 can be disabled, i.e., clocks CLK 140 and CLK# 142 are both driven low or both driven high, or can be running at a non-standard operating frequency in event 712. For example, the JEDEC DDR3 SDRAM standard specifies that the normal operating frequency of a prior art registered memory module 120 is 400 mega hertz (Mhz), 533 Mhz or 667 Mhz. As specified in the JEDEC DD3 SDRAM standard, the PLL 124 can also be locked into a non-standard frequency, within a minimum to maximum range, which for one class of register is from 300 MHz to 670 MHz. At time 702, the memory controller 110 switches the prior art registered memory module 120 into synchronous mode and the PLL 124 starts to lock to the input differential clocks CLK 140/CLK# 142. The prior art registered memory module 120 is inoperable when the PLL 124 is locking in event 714. The time required to lock the PLL 124 varies and it is illustrated as six microseconds in switching sequence 710. After the PLL 124 is locked at time 704, the prior art registered memory module 120 operates synchronously in high power mode in event 716. In event 718, the memory controller 110 switches the registered memory module 120 into an asynchronous mode. There is no black out period when switching over from synchronous to asynchronous mode. The prior art registered memory module 120 is inoperable whenever it switches from asynchronous to synchronous mode. This reduces the efficiency of the prior art registered memory module 120.

Referring to FIGS. 3A and 7 in accordance with one embodiment of the invention, in switching sequence 750, the registered memory module 306 is operating asynchronously in low power mode in event 752. In event 752, the PLL 314 is deactivated and in bypass mode, i.e., enable signal 322 is de-asserted and bypass signal 324 is asserted. The memory controller 305 operates the registered memory module 306 asynchronously in event 752. At time 702, the memory controller 305 switches the registered memory module 306 into a synchronous mode and the PLL 314 starts to lock to the input differential clocks CLK 140/CLK# 142 when the decode logic 320 asserts the enable signal 322. The registered memory module 306 is operable in asynchronous mode when the PLL 314 is locking in event 754. After the PLL 314 is locked at time 704, the registered memory module 306 operates synchronously in high power mode in event 756 when the decode logic 320 de-asserts the bypass signal 324.

In event 758, the memory controller 305 switches the registered memory module 306 into an asynchronous mode when the decode logic 320 asserts the bypass signal 324 and de-asserts the enable signal 322. In one embodiment of the invention, the registered memory module 306 is advantageous over the prior art registered memory module 120 as there are no black out periods when switching over from synchronous to asynchronous mode. This increases the efficiency of the registered memory module 306. The event 760 shows the minimum time of 512 cycles required by the DLL in the memory unit 390 to be locked to its input clocks.

FIG. 8 illustrates a comparison between a switching sequence 810 of a prior art DRAM 126 and a switching sequence 850 of a memory unit 390 in accordance with one embodiment of the invention. For clarity of illustration, the switching sequence 810 is discussed with reference to FIG. 1 and the switching sequence 850 is discussed with reference to FIGS. 3A and 4. One of ordinary skill in the relevant will readily appreciate that the switching sequence 850 applies to other embodiments of the invention disclosed herein.

Referring to FIGS. 1 and 8, in the switching sequence 810, the prior art DRAM 126 is operating in a self refresh or pre-charge power down mode 812. The prior art DRAM 126 is at least partly compliant with JEDEC DDR3 SDRAM standard and in the self-refresh or pre-charge power down mode 812, the DLL in the prior art DRAM 126 is turned off. At time 802, the memory controller 110 switches the prior art DRAM 126 into a synchronous mode and the DLL starts to lock to the input differential clocks CLK 150/CLK# 152. The memory controller 110 is not able to perform asynchronous read operations to the prior art DRAM 126 and can only perform asynchronous write operations to the prior art DRAM 126 when the DLL is locking in event 814. The minimum time required to lock the DLL 124 is specified as 512 cycles according to the JEDEC DDR3 SDRAM standard and more than 512 cycles may be needed in order to lock the DLL. After the DLL is locked at time 804, the prior art DRAM 126 operates synchronously in event 816. There is a period in event 814 where the prior art DRAM 126 cannot be read asynchronously whenever the prior art DRAM 126 switches from self-refresh or pre-charge power down to synchronous mode. This reduces the efficiency of the prior art DRAM 126.

Referring to FIGS. 3A, 4 and 8 in accordance with one embodiment of the invention, in switching sequence 850, the memory unit 390 is operating in a self-refresh or pre-charge power down mode 852. The DLL 410 in the memory unit 390 is switched off in self-refresh mode or pre-charge power down by the decode logic 440 that de-asserts the enable signal 450. At time 802, the memory controller 305 switches the memory unit 390 into synchronous mode and the DLL 410 starts to lock to the input differential clocks CLK 350/CLK# 352 when the decode logic 440 asserts the enable signal 450. The memory controller 305 is able to perform asynchronous read and write operations to the memory unit 390 when the memory unit 390 is in bypass mode, i.e. the bypass signal 452 is asserted. After the DLL 410 is locked at time 804, the memory unit 390 operates synchronously in event 856 when the decode logic 450 de-asserts the bypass signal 452. The memory unit 390 can be read and write asynchronously whenever the memory unit 390 switches from self-refresh or pre-charge power down to synchronous mode. In addition, there is also no need to enter self-refresh or pre-charge power down mode of the memory 390 in order to switch off the DLL 410. This increases the efficiency of the DRAM 390.

Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus comprising:
   a phase-locked loop (PLL) to provide a differential clock to a memory; and
   logic to facilitate enabling or disabling the PLL without any interruption to operation of the memory, wherein the operation of the memory comprises asynchronous read and write operations to the memory and the apparatus is to allow a variable number of clock cycles to elapse before data is sent to the memory during the asynchronous write operation to the memory.

2. The apparatus of claim 1, wherein the logic to facilitate enabling or disabling the PLL comprises logic to select between an input differential clock to the PLL and an output differential clock of the PLL as the provided differential clock to the memory.

3. The apparatus of claim 1, wherein the logic to facilitate enabling or disabling the PLL comprises logic to enable or disable a connection between the input differential clock to the PLL and the PLL.

4. The apparatus of claim 1, wherein the logic to facilitate enabling or disabling the PLL comprises logic to enable or disable power to the PLL.

5. The apparatus of claim 1, wherein the apparatus is coupled with an external logic and wherein the external logic is to enable or disable power to the PLL.

6. The apparatus of claim 1, further comprising decode logic to:
   decode a received command;
   determine that the decoded received command is to enable or disable the PLL; and
   provide one or more control signals to the logic to facilitate enabling or disabling the PLL.

* * * * *